US008117513B2

(12) United States Patent
Wen et al.

(10) Patent No.: US 8,117,513 B2
(45) Date of Patent: *Feb. 14, 2012

(54) TEST METHOD AND TEST PROGRAM OF SEMICONDUCTOR LOGIC CIRCUIT DEVICE

(75) Inventors: Xiaoqing Wen, Fukuoka (JP); Seiji Kajihara, Fukuoka (JP)

(73) Assignee: LPTEX Corporation, Tokyo (JP)

( * ) Notice: Subject to any disclaimer, the term of this patent is extended or adjusted under 35 U.S.C. 154(b) by 1037 days.

This patent is subject to a terminal disclaimer.

(21) Appl. No.: 11/887,383

(22) PCT Filed: Mar. 27, 2006

(86) PCT No.: PCT/JP2006/306142
§ 371 (c)(1),
(2), (4) Date: Sep. 28, 2007

(87) PCT Pub. No.: WO2006/106626
PCT Pub. Date: Oct. 12, 2006

(65) Prior Publication Data
US 2009/0083593 A1 Mar. 26, 2009

(30) Foreign Application Priority Data

Mar. 30, 2005 (JP) ................................. 2005-097015
Apr. 28, 2005 (JP) ................................. 2005-130806

(51) Int. Cl.
*G01R 31/28* (2006.01)
*G06F 11/00* (2006.01)
(52) U.S. Cl. ....................................... 714/741; 714/739
(58) Field of Classification Search .................. 714/724, 714/726, 727, 729, 731, 733, 734, 736, 738
See application file for complete search history.

(56) References Cited

U.S. PATENT DOCUMENTS 5,132,974 A * 7/1992 Rosales ........................ 714/731
5,305,328 A * 4/1994 Motohara et al. ............. 714/741
(Continued)

FOREIGN PATENT DOCUMENTS
JP          4-244979          9/1992
(Continued)

OTHER PUBLICATIONS

Abrammovici, Miron, et al., "Digital Systems Testing and Testable Design", Computer Science Press, pp. 245-246, 1990.
Lin, X., et al., "On Static Test Compation and Test Pattern Ordering for Scan Designs", Proc. VLSI Test Symp., pp. 1088-1097, 2001.

(Continued)

*Primary Examiner* — Jeffrey A Gaffin
*Assistant Examiner* — Daniel McMahon
(74) *Attorney, Agent, or Firm* — McGinn Intellectual Property Law Group, PLLC

(57) ABSTRACT

In a combinational portion, when there is one or more unspecified bits in pseudo external input lines and there is no unspecified bit in pseudo external output lines, an assigning operation is carried out. In the combinational portion, when there is one or more unspecified bits in the pseudo external output lines and there is no unspecified bit in the pseudo external input lines, first and second justifying operations are carried out, and a necessary logic value is determined for an unspecified bit of the test cube. In the combinational portion, when there are one more unspecified bits not only in the pseudo external input lines but also the pseudo external output lines, an assigning operation, a justifying operation or first and second assigning/justifying operations are performed upon a focused bit pair.

16 Claims, 8 Drawing Sheets

U.S. PATENT DOCUMENTS

| | | | | |
|---|---|---|---|---|
| 5,377,197 A | * | 12/1994 | Patel et al. | 714/724 |
| 5,590,135 A | * | 12/1996 | Abramovici et al. | 714/724 |
| 5,625,630 A | * | 4/1997 | Abramovici et al. | 714/724 |
| 5,737,341 A | * | 4/1998 | Hosokawa | 714/726 |
| 6,543,020 B2 | * | 4/2003 | Rajski et al. | 714/738 |
| 6,751,767 B1 | * | 6/2004 | Toumiya | 714/738 |
| 6,795,948 B2 | * | 9/2004 | Lin et al. | 716/1 |
| 6,865,706 B1 | * | 3/2005 | Rohrbaugh et al. | 714/738 |
| 7,124,342 B2 | * | 10/2006 | Wang et al. | 714/741 |
| 2004/0250186 A1 | | 12/2004 | Takasaki | |
| 2009/0259898 A1 | * | 10/2009 | Wen et al. | 714/726 |

FOREIGN PATENT DOCUMENTS

| | | |
|---|---|---|
| JP | 2001-99901 | 4/2001 |
| JP | 2004-361351 | 12/2004 |

OTHER PUBLICATIONS

Sankaralingam, R., et al., "Static Compaction Techniques to Control Scan Vector Power Dissipation", Proc. VLSI Test Symp., pp. 35-40, 2000.

Kajihara, S., et al., "Test Vector Modification for Power Reduction during Scan Testing", Proc. VLSI Test Symp., pp. 160-165, 2002.

Form PCT/IB/306.
Form PCT/IB/304.
Form PCT/IB/301.
PCT/ISA/210.
PCT/ISA/220.
PCT/ISA/237.
International Search Report dated Oct. 11, 2007 with English Translation; (PCT Forms PCT/IB/338,PCT/IB373, and PCT/ISA/237).

* cited by examiner

Fig. 3

| PPI \ PPO | WITHOUT X | WITH X |
|---|---|---|
| WITHOUT X | CASE 1 | CASE 3 |
| WITH X | CASE 2 | CASE 4 |

Fig. 6
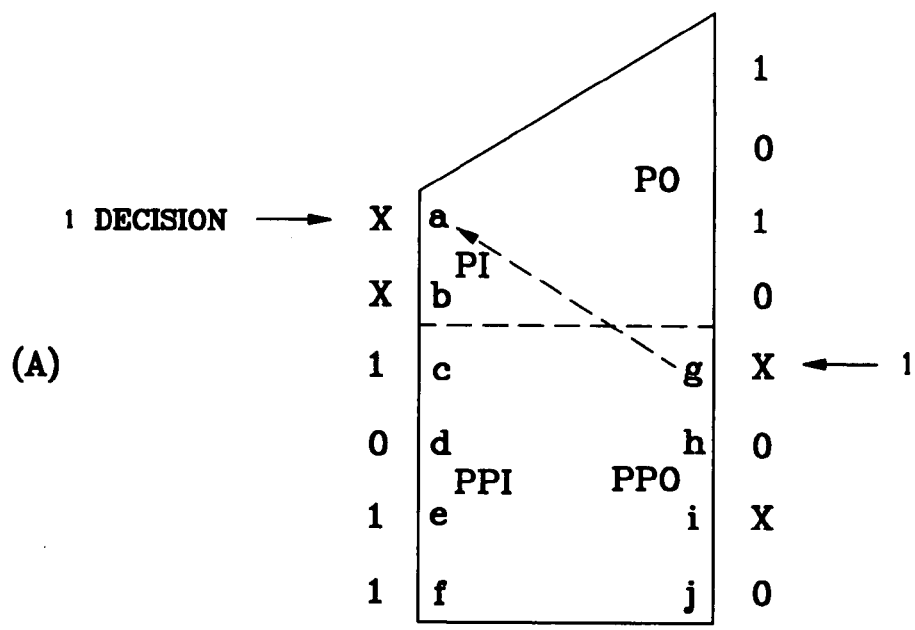
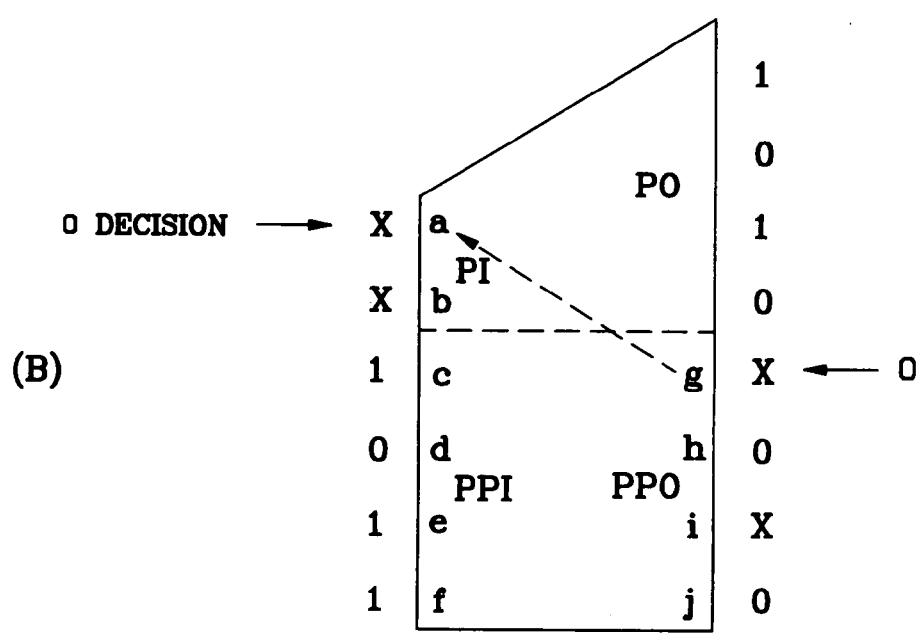

Fig. 7

| BIT PAIR / TYPE | ppi | ppo |
|---|---|---|
| TYPE A | 0/1 | 0/1 |
| TYPE B | X | 0/1 |
| TYPE C | 0/1 | X |
| TYPE D | X | X |

Fig. 8
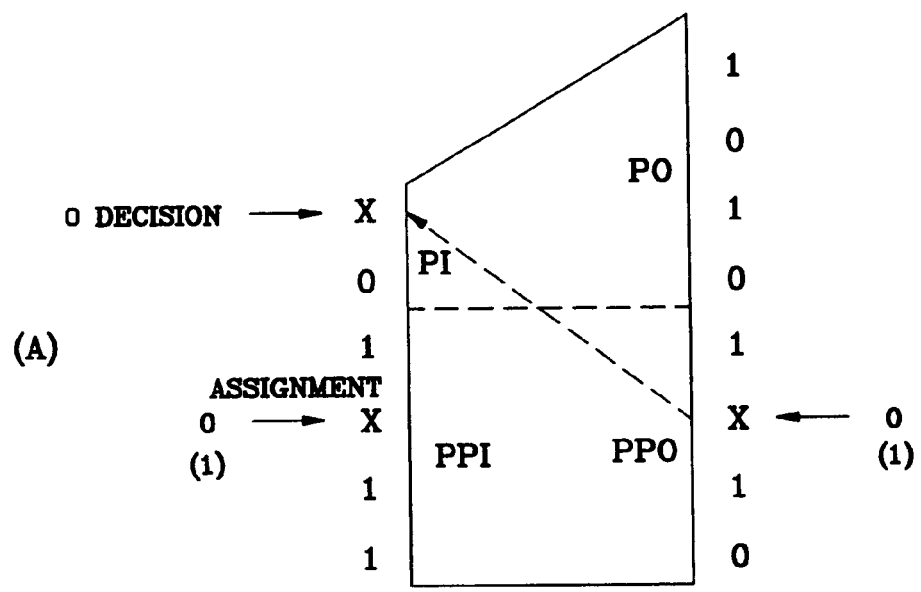
(A)
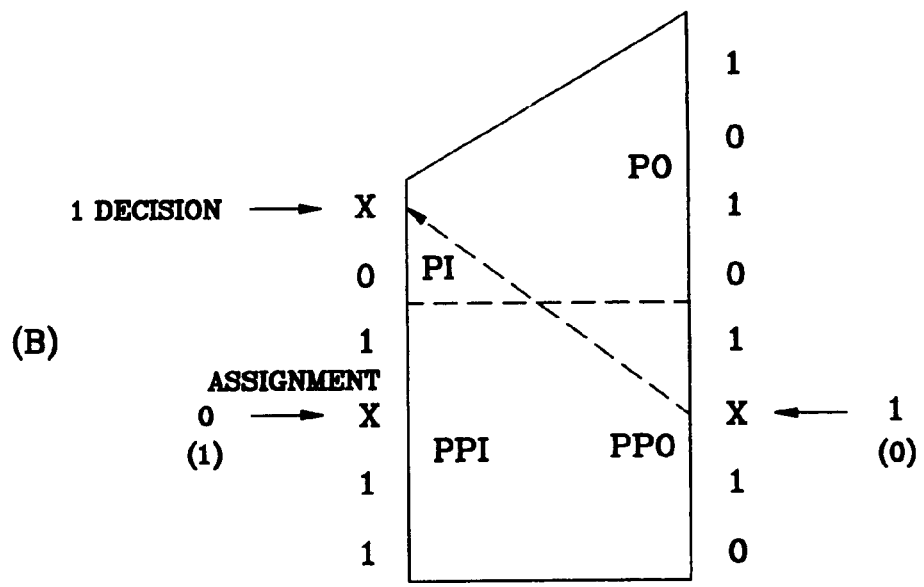
(B)

TEST METHOD AND TEST PROGRAM OF SEMICONDUCTOR LOGIC CIRCUIT DEVICE

TECHNICAL FIELD

The present invention relates to a test method and test program of a semiconductor logic circuit device.

BACKGROUND TECHNOLOGY

Semiconductor logic circuit devices are shipped through three steps, i.e., a design step, a production step and a test step. Here, a test is to apply a test vector upon a manufactured semiconductor logic circuit device, to observe a test response from the semiconductor logic circuit device, and to compare the test response with an expected test response, thus determining whether the semiconductor logic circuit device is good or defective. The rate of good semiconductor logic circuit devices is called a manufacturing yield which would remarkably affect the semiconductor logic circuit devices in quality, reliability and manufacturing cost.

Generally, a semiconductor logic circuit device (mainly, a sequential circuit) is constructed by a combinational portion formed by logic elements such as AND (AND) gates, NAND (NAND) gates, OR (OR) gates and NOR (NOR) gates, and flip-flops storing an internal state of the circuit. In this case, the combinational portion has external input lines (PI), pseudo external input lines (PPI) serving as output lines of the flip-flops, external output lines (PO), and pseudo external output lines (PPO) serving as input lines of the flip-flops. Inputs to the combinational portion are ones supplied directly from the external input lines and ones supplied by the pseudo external input lines. Also, outputs from the combinational portion are ones appearing directly at the external output lines and ones appearing at the pseudo external output lines.

In order to test the combinational portion of a semiconductor logic circuit device, a predetermined test vector is required to be applied thereto from the external input lines and the pseudo external input lines of the combinational portion, and a test response is required to be observed from the external output lines and the pseudo external output lines of the combinational portion. Here, one test vector is formed by bits corresponding to the external input lines and the pseudo external input lines. Also, one test response is formed by bits corresponding to the external output lines and the pseudo external output lines.

However, it is generally impossible to directly access the output lines of the flip-flops (the pseudo external input lines) and the input lines of the flip-flops (the pseudo external output lines) in the semiconductor logic circuit device from the exterior. Therefore, in order to test the combinational portion, there are problems in the controllability of the pseudo external input lines and the observableness of the pseudo external output lines.

A scan design is a technique for solving the problems of controllability and observableness in the test of the combinational portion. Such a scan design is to replace the flip-flops with scan flip-flops by which one or a plurality of scan chains are formed. The scan flip-flops are controlled by a scan enable (SE) signal. For example, when the scan enable (SE) signal is at logic value 0, the scan flip-flops carry out the same operation as conventional flip-flops, so that, if a clock pulse is given, the output values of the scan flip-flops are renewed by the combinational portion. On the other hand, when the scan enable (SE) signal is at logic value 1, the scan flip-flops with the other scan flip-flops within the same scan chain form one shift register, so that, if a clock pulse is given, new values are shifted from the exterior in the scan flip-flops, and simultaneously, values which have been in the scan flip-flops are shifted out to the exterior. Generally, scan flip-flops in the same scan chain share the same scan enable (SE) signal; however, scan enable (SE) signals in different scan chains may be the same or different from each other.

A test for a scan-designed semiconductor logic circuit device is carried out by repeating shift operations and capture operations. A shift operation is carried out in a shift mode where the scan enable (SE) signal is at logic value 1. In the shift operation, one or a plurality of new values given from the exterior are shifted in the scan flip-flops within the scan chain. Also, simultaneously, one or a plurality of values which have been located in the scan flip-flops within the scan chain are shifted out to the exterior. A capture operation is carried out in a capture mode where the scan enable (SE) signal is at logic value 0. In the capture mode, one clock pulse is simultaneously given to all the scan flip-flops in one scan chain, so that the values of the pseudo external output lines of the combinational portion are taken into all the scan flip-flops.

A shift operation is used for applying a test vector to the combinational portion through the pseudo external input lines and for observing a test vector from the combinational portion through the pseudo external output lines. Also, a capture operation is used for taking a test response of the combinational portion in the scan flip-flops. Shift operations and capture operations are repeated upon all test vectors, thus testing the combinational portion. Such a test method is called a scan test method.

In a scan test method, application of a test vector to the combinational portion is formed by a portion applied directly from the exterior inputs and a portion applied by shift operations. Since an arbitrary logic value is set in an arbitrary scan flip-flop, the problem of controllability of the pseudo external input lines is solved. Observation of a test response from the combinational portion is formed by a portion carried out directly from the external output lines and a portion carried out by shift operations. Since an output value of an arbitrary scan flip-flop can be observed by shift operations, the problem of observableness of the pseudo external input lines is solved. Thus, in a scan test method, it is only necessary to obtain a test vector and an expected test response for the combinational portion by using an automatic test pattern generation (ATPG) program.

Despite the effectiveness of the above-mentioned scan test method, there is a problem in that the power consumption is remarkably larger in a test mode than in a usual operation mode. For example, if the semiconductor logic circuit device is constructed by CMOS circuits, the power consumption consists of static power consumption due to leakage currents and dynamic power consumption due to switching operations of the logic gates and the flip-flops. Additionally, the latter dynamic power consumption consists of shift power consumption in shift operations and capture power consumption in capture operations.

Generally, a large number of clock pulses are required for one test vector in shift operations. For example, in order to set new values in all the scan flip-flops of a scan chain, a number of clock pulses corresponding to the number of the scan flip-flops are required at most. As a result, the shift power consumption is increased to induce excessive heat. Therefore, semiconductor logic circuit devices would be damaged. Various techniques for decreasing the shift power consumption have been vigorously developed.

On the one hand, generally, a single clock pulse per one scan chain is required for one test vector in a capture operation. Therefore, heat by the capture operation mode creates no problem. However, in a capture mode, when a test response of the combinational portion appearing at the pseudo external output lines is taken in the scan flip-flops, if the values of the test response are different from the current values of the scan flip-flops, the values of the corresponding scan flip-flops change. If the number of the scan flip-flops whose output values have changed, the power supply voltage is instantaneously changed by the switching operation of the logic gates and the scan flip-flops. This is also called an IR (I: current and R: resistance) drop phenomenon. The IR drop phenomenon would erroneously operate the circuit so as to take erroneous test response values in the scan flip-flops. Thus, even semiconductor logic circuit devices normally operable in a usual state would be deemed to be defective in a test state, which can be an erroneous test. As a result, the manufacturing yield would be decreased. Particularly, when semiconductor logic circuit devices become ultra-large in scale, more fine-structured and lower in power supply voltage, the manufacturing yield caused by the erroneous test would be remarkably decreased. Therefore, it is essential to decrease the capture power consumption.

When a single clock signal is used in a test mode, the capture power consumption can be decreased by a clock gating technique; however, this would remarkably affect the physical design of semiconductor logic circuit devices. Also, when multiple clock signals are used in a test mode, the capture power consumption can be decreased by a one hot technique or a multiple clock technique; however, the former technique would remarkably increase test data amount, and the latter technique would require enormous memory consumption in generating test vectors which is a large burden to an ATPG program. Therefore, in view of the decrease of the capture power consumption, it is expected to decrease the impact to the physical design, to suppress the increase of test data amount and to decrease the burden of an ATPG program.

On the other hand, many test cubes, i.e., input vectors with unspecified bits (hereinafter, referred to as X-bits) are usually generated in a process for generating test vectors using an ATPG program. Also, when a set of test vectors without X-bits are given, some bits of some test vectors can be converted into X-bits without changing the fault detection rate of the set of test vectors. That is, test cubes can be obtained by an X-bit extracting program. The reason for the existence of test cubes is mainly to have only to set necessary logic values in a part of bits of the external input lines and the pseudo external input lines in order to detect one target fault in the combinational portion. Since assignment of 0's or 1's to the remainder bits does not affect the detection of the target fault, such remainder bits are X-bits for the target fault.

A test cube with X-bits is strictly an intermediate product appearing in a process for generating a test cube without X-bits. Therefore, logic values (0 or 1) finally have to be filled into the X-bits of the test cube in an appropriate method, i.e., an algorithm filling method, a merge filling method or a random filling method.

The algorithm filling method determines and fills optimum logic values (0 or 1) for the X-bits in a test cube in an algorithm in order to obtain an object. Such an algorithm is often mounted on an ATPG program. This algorithm filling method is used for decreasing the total number of test vectors in dynamic compaction (see: non-patent documents 1 and 2) or for decreasing the shift power consumption (see: non-patent document 3).

When a test cube is merged with another test cube, the merge filling method fills 0 or 1 in X-bits of the test cubes so that a bit of the test cube has the same logic value as its corresponding bit of the other test cube. For example, in order to merge a test cube 1X0 with a test cube 11X, 1 is assigned to the X-bit of the test cube 1X0 and 0 is assigned to the X-bit of the test cube 11X. This merge filling method is used for decreasing the total number of test vectors in static compaction (see: non-patent document 1) or for decreasing the shift power consumption (see: non-patent document 4).

The random filling method assigns 0 or 1 randomly to X-bits in a test cube. This random filling method is often carried out for remaining X-bits after the algorithm filling method or the merge filling method is carried out. This random filling method is used for decreasing the total number of test vectors in dynamic compaction (see: non-patent document 1) or for decreasing the shift power consumption (see: non-patent document 4).

Non-patent document 1: M. Abramovici, M. Breuer, and A. Friedman, Digital Systems Testing and Testable Design, Computer Science Press, pp. 245-246., 1990.

Non-patent document 2: X. Lin, J. Rajski, I. Pomeranz, S. M. Reddy, "On Static Test Compaction and Test Pattern Ordering for Scan Designs", Proc. Intl. Test Conf., pp. 1088-1097, 2001.

Non-patent document 3: S. Kajihara, K. Ishida, and K. Miyase, "Test Vector Modification for Power Reduction during Scan Testing", Proc. VLSI Test Symp., pp. 160-165, 2002.

Non-patent document 4: R. Sankaralingam, R. Oruganti, and N. Touba, "Static Compaction Techniques to Control Scan Vector Power Dissipation", Proc. VLSI Test Symp., pp. 35-40, 2000.

SUMMARY OF THE INVENTION

Problem to be Solved by the Invention

The above-described algorithm filling method, merge filling method and random filling method for filling 0 or 1 in X-bits, however, are intended to decrease the total number of test vectors or decrease the shift power consumption, so that an erroneous test caused by the increase of the capture power consumption cannot be avoided, and thus, the manufacturing yield is decreased, which is a problem.

Therefore, an object of the present invention is to provide a test method and test program of a semiconductor logic circuit device which decreases the capture power consumption by decreasing the number of output switching scan flip-flops in a capture operation, thus avoiding an erroneous test.

Means for Solving the Problem

In order to attain the above-mentioned object, in a test method of a semiconductor logic circuit device comprising a combinational portion having external input lines, pseudo external input lines, external output lines and pseudo external output lines; and a plurality of scan flip-flops connected between the pseudo external output lines and the pseudo external input lines, so that the scan flip-flops are connected in series to each other as a shift register, thus realizing at least one scan chain, a test cube including one or more unspecified bits in the external input lines and the pseudo external input lines is converted into a test vector including no unspecified bits so that the number of discrepancies between bits of the pseudo external input lines and respective bits of the pseudo external output lines is decreased.

Effect of the Invention

According to the present invention, since the number of output switching scan flip-flops in a capture operation is decreased, the capture power consumption can be decreased, thus avoiding an erroneous test caused by the decrease of the power supply voltage due to the IR drop.

BRIEF DESCRIPTION OF THE DRAWINGS

FIG. 3 A table showing the case types of step 202 of FIG. 2.

FIG. 6 A diagram explaining steps 207 and 209 of FIG. 2.

FIG. 7 A table explaining the bit pair types of steps 210 of FIG. 2.

FIG. 8 A diagram explaining steps 216 and 218 of FIG. 2.

| DESCRIPTION OF THE SYMBOLS | |
|---|---|
| 1L: | combinational portion |
| 12-1, 12-2, . . . , 12-n: | scan flip-flops |
| PI: | external input lines |
| PPI: | pseudo external input lines |
| PO: | external output lines |
| PPO: | pseudo external output lines |
| SC: | scan chain |

BEST MODE CARRYING OUT THE INVENTION

Figure 1:
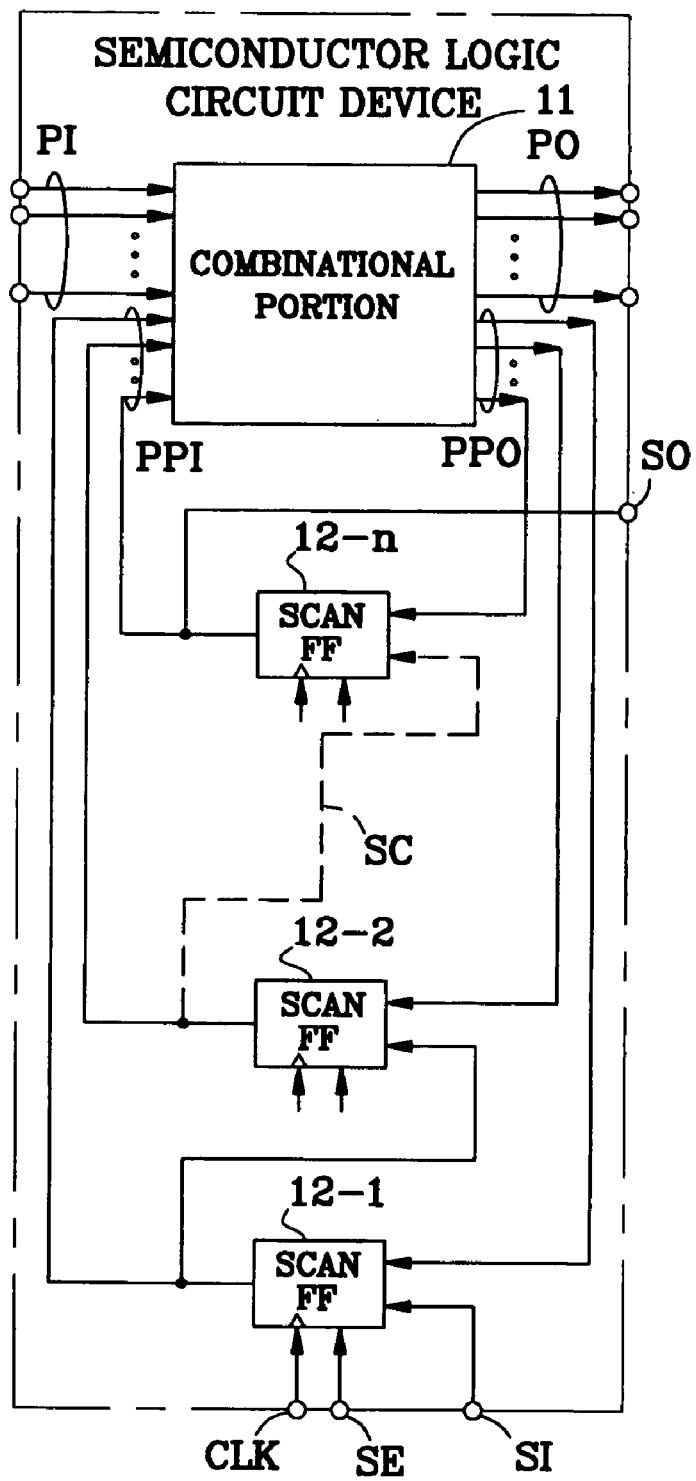
FIG. 1 A block circuit diagram illustrating an embodiment of the semiconductor logic circuit device according to the present invention.

FIG. 1 is a block circuit diagram illustrating an embodiment of the semiconductor logic circuit device according to the present invention.

The semiconductor logic circuit device of FIG. 1 is constructed by a combinational portion 11 formed by logic elements such as AND gates, OR gates, NAND gates, and NOR gates, and scan flip-flops 12-1, 12-2, . . . , 12-n.

The combinational portion 11 has external input lines PI, pseudo external input lines PPI serving as output lines of the scan flip-flops 12-1, 12-2, . . . , 12-n, external output lines PO, and pseudo external output lines PPO serving as input lines of the scan flip-flops 12-1, 12-2, . . . , 12-n. Note that the number of the external input lines PI is not always the same as that of the external output lines PO; however, the number of the pseudo external input lines PPI is always the same as that of the pseudo external output lines PPO.

In each of the scan flip-flops 12-1, 12-2, . . . , 12-n, a first input (lower input) terminal is used for a shift mode, while a second input (upper input) terminal is used for a capture mode. Therefore, when a scan enable (SE) signal is at logic value 1, the first inputs of the scan flip-flops 12-1, 12-2, . . . , 12-n are selected, while, when the scan enable (SE) signal is at logic value 0, the second inputs of the scan flip-flops 12-1, 12-2, . . . , 12-n are selected. Note that the first input terminal of the scan flip-flop 12-1 is connected to a scan-in terminal SI, and the output terminal of the scan flip-flop 12-n is connected to a scan-out terminal SO; however, the present invention is applied to not only a case where only one scan chain is provided, but also a case where a plurality of scan chains are provided.

That is, in a shift mode, the SE signal is set at logic value 1, so that the scan flip-flops 12-1, 12-2, . . . , 12-n read data from their lower inputs. Therefore, the scan flip-flop 12-1, the scan flip-flop 12-2, . . . , the scan flip-flop 12-n and the scan-out terminal SO are connected so that a scan chain SC is realized between the scan-in terminal SI and the scan-out terminal SO. At this time, the scan flip-flops 12-1, 12-2, . . . , 12-n serve as a shifter register operated by clock pulses of a clock CLK, so that a new test vector is shifted in, and simultaneously, a test response to a previous test vector is shifted out.

On the other hand, in a capture mode, the SE signal is set at logic value 0, so that, when clock pulses are given to the clock CLK, the logic values at the pseudo external output lines PPO of the combinational portion 11 are simultaneously taken in the scan flip-flops 12-1, 12-2, . . . , 12-n.

Figure 2:
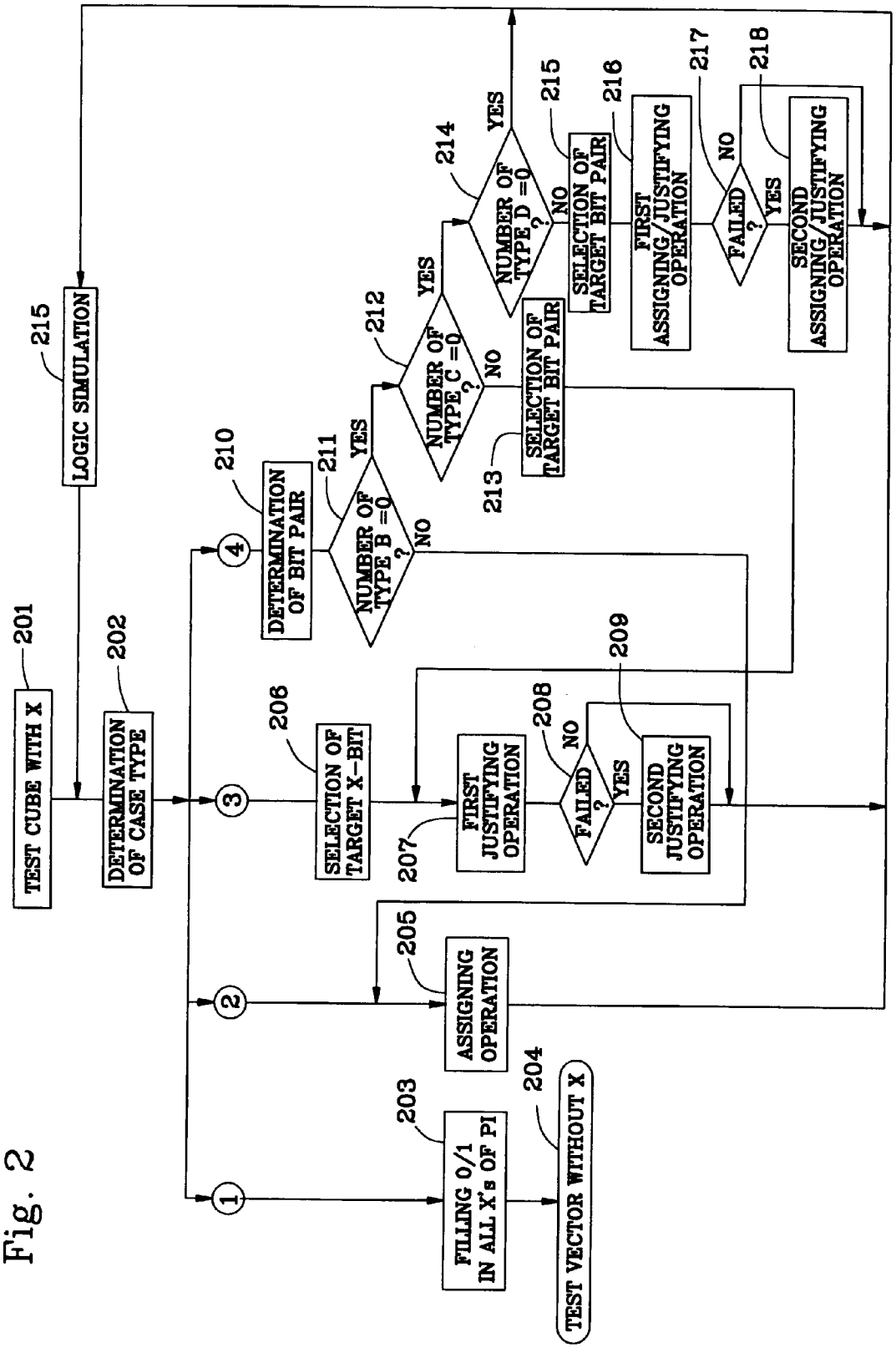
FIG. 2 A flowchart of a processing for converting a test cube including X-bits into a test vector including no X-bits in order to test the semiconductor logic circuit device of FIG. 1.

FIG. 2 shows a process for converting a test cube including X-bits into a test vector including no X-bits by filling 0 or 1 in the X-bits of the test cube in the semiconductor logic circuit device of FIG. 1. Note that the test cube is assumed to be generated by an APTG program or an X-bit extracting program. Here, a test cube is defined as an input vector including X-bits corresponding to the external input lines PI and the pseudo external input lines PPI. In this case, since the external input lines PI and the pseudo external input lines PPI include X-bits, the external output lines PO and the pseudo external output lines PPO include X-bits. In other words, when the external input lines PI and the pseudo external input lines PPI include no X-bits, the external output lines PO and the pseudo external output lines PPO automatically include no X-bits. Thus, the routine of FIG. 2 converts a test cube including X-bits into a test vector including no X-bits.

First, at step 201, a test cube including X-bits obtained by an APTG program or an X-bit extracting program is given.

Figure 4:
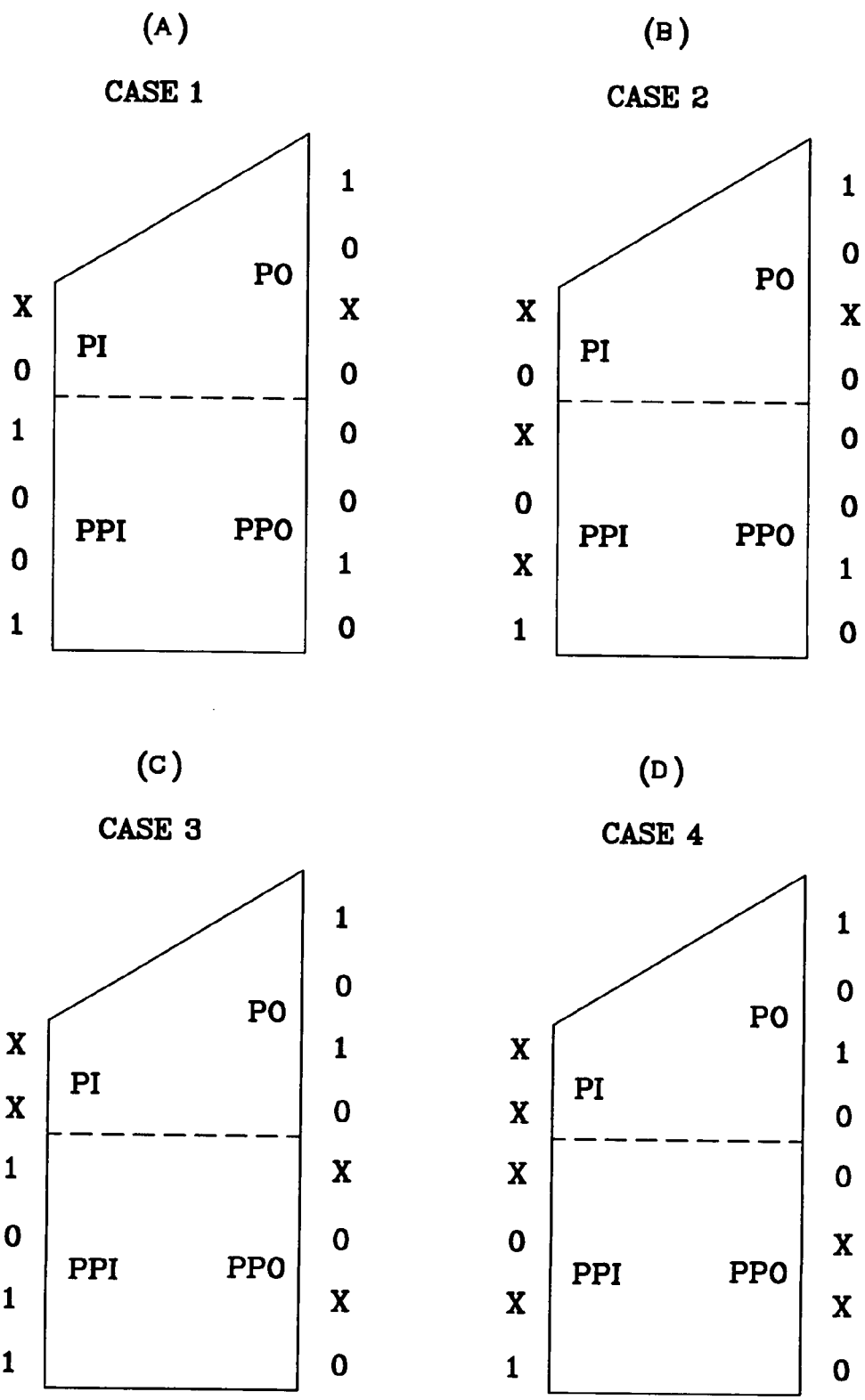
FIG. 4 A diagram showing the case types of step 202 of FIG. 2.

Next, at step 202, the case type is determined. Here, there are four case types as the case type as shown in FIG. 3. That is, Case type 1: A state where the pseudo external input lines PPI and the pseudo external output lines PPO have no X-bits as shown in (A) of FIG. 4;

Case type 2: A state where the pseudo external input lines PPI have at least one X-bit and the pseudo external output lines PPO have no X-bits as shown in (B) of FIG. 4;

Case type 3: A state where the pseudo external input lines PPI have no X-bits and the pseudo external output lines PPO have at least one X-bit as shown in (C) of FIG. 4; and Case type 4: A state where the pseudo external input lines PPI have at least one X-bit and the pseudo external output lines PPO have at least one X-bit as shown in (D) of FIG. 4.

In the case of Case type 1, the control proceeds to step 203. At step 203, the number of the output switching scan flip-flops cannot be decreased; however, since Case type 1 shows a test cube, there are always one or more X-bits in the external input lines PI as shown in (A) of FIG. 4. As a result, the external output lines P0 may have one or more X-bits. At step 203, 0 or 1 is filled in all the X-bits of the external input lines PI in order to decrease the number of test vectors and decrease the shift power consumption. As a result, at step 204, a test vector with no X-bits can be obtained.

Figure 5:
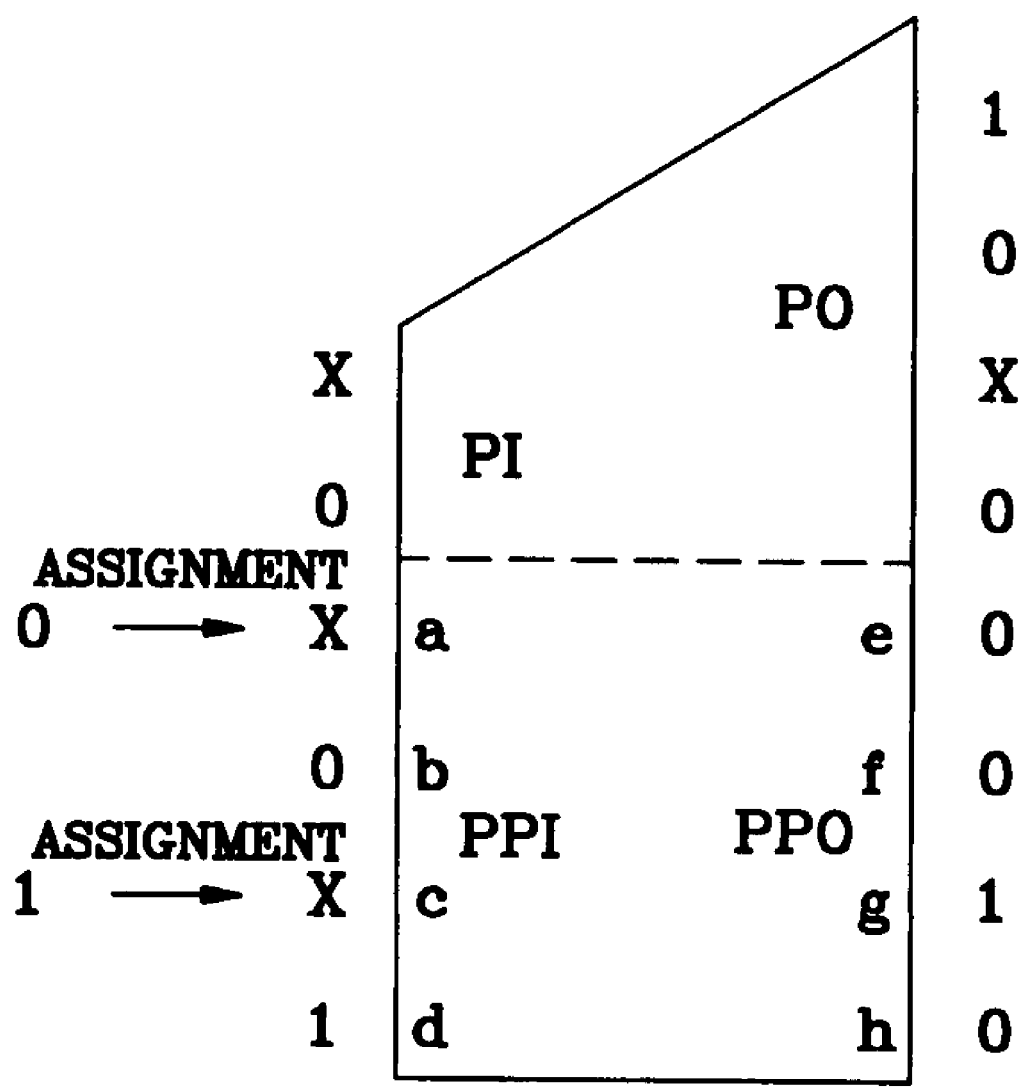
FIG. 5 A diagram explaining step 205 of FIG. 2.

In the case of Case type 2, the control proceeds to step 205 which assigns to all the X-bits of the pseudo external input lines PPI logic values at corresponding bits of the pseudo external output lines PPO. For example, as shown in FIG. 5, logic value 0 at the corresponding bit "e" of the pseudo external output lines PPO is assigned to the X-bit "a" of the pseudo external input lines PPI, and also, logic value 1 at the corresponding bit "g" of the pseudo external output lines PPO is assigned to the X-bit "c" of the pseudo external input lines PPI. Thus, the output of the scan flip-flop corresponding to the bit "a" and the bit "e" and the output of the scan flip-flop corresponding to the bit "c" and the bit "g" are not switched in a capture operation. no X-bit. Then, the control proceeds to step 219.

In the case of Case type 3, the control proceeds to step 206 which selects a target X-bit. First, it is determined whether the number of X-bits of the pseudo external output lines PPO is 1 or more than 1. When there is only one X-bit, this X-bit is selected as the target X-bit. When there are more than 1 X-bit, one of the X-bits to be processed is selected and this selected X-bit is a target X-bit. Generally, such an X-bit is selected in accordance with the sequence of success rates of X-bits in the justifying operation at next step 207.

Next, at step 207, a first justifying operation is carried out. That is, as shown in (A) of FIG. 6, a required logic value is assigned to one X-bit of the test cube so that the logic value V (for example, 1) of the bit of the pseudo external input lines PPI corresponding to the target X-bit may appear at the target X-bit of the test cube. As a result, if this assignment is successful, the control proceeds via step 208 to step 209.

On the other hand, in the above-described first justifying operation, a necessary logic value may not be assigned and therefore, the assignment may fail. When this first justifying operation has failed, the control proceeds from step 208 to step 209 which carries out a second justifying operation. That is, as shown in (B) of FIG. 6, a necessary logic value is assigned to one X-bit of the test cube so that the logic value P (for example, 0) of the bit of the pseudo external input lines PPI corresponding to the target X-bit may appear at the target X-bit of the test cube. Then, the control proceeds to step 209.

FIG. 6 is explained briefly below. In FIG. 6, assume that the X-bit "g" of the pseudo external output lines PPO is a target X-bit. In the first justifying operation ((A) of FIG. 6), logic value 1 is determined for the X-bit "a" within the test cube, so that the logic value 1 at bit "c" of the pseudo external input lines PPI corresponding to the target X-bit "g" may appear at the target X-bit "g". In this case, logic value 1 is assigned to the X-bit "a" within the test cube. In the second justifying operation ((B) of FIG. 6), logic value 0 is determined for the X-bit "a" within the test cube, so that the value 0 opposite to the logic value 1 at bit "c" of the pseudo external input lines PPI corresponding to the target X-bit "g" may appear at the target X-bit "g". In this case, logic value 0 is assigned to the X-bit "a" within the test cube.

In the case of Case type 4, first, at step 210, attention is paid to each bit pair (ppi, ppo) of the pseudo external input lines PPI and the pseudo external output lines PPO, and the following types A, B, C and D as defined in FIG. 7:

Type A: A state where any of "ppi" and "ppo" is not an X-bit;
Type B: A state where "ppi" is an X-bit and "ppo" is not an X-bit;
Type C: A state where "ppi" is not an X-bit and "ppo" is an X-bit; and
Type D: A state where both of "ppi" and "ppo" are X-bits.
No processing is performed upon bit pairs of Type A.

Step 211 determines whether or not the number of bit pairs of Type B is zero, step 212 determines whether or not the number of bit pairs of Type C is zero, and step 213 determines whether or not the number of bit pairs of Type C is zero. As a result, when there are one or more bit pairs of Type B, the control proceeds to step 205 which performs an assigning operation upon all the bit pairs of Type B, and then, the control proceeds to step 219. On the other hand, when there is no bit pair of Type B and there are one or more bit pairs of Type C, the control proceeds to step 213 which one bit pair of Type C as a target bit pair. Then, a first justifying operation at step 207 is performed upon the target bit pair, and also, when the first justifying operation has failed, the control proceeds from step 208 to step 209 which performs a second justifying operation upon the target bit pair. After that, the control proceeds to step 219. Additionally, when there is no bit pair of Type B and no bit pair of Type C, the control proceeds to steps 214 and 218.

At step 214, it is determined whether or not the number of bit pairs of Type D is zero. As a result, when there is no bit pair of Type B and Type C and there are one or more bit pairs of Type D, the control proceeds to step 215.

At step 215, first, one of the bit pairs of Type D is selected as one target bit pair. Generally, a bit pair having a high success rate of a first assigning/justifying operation at next step 216 is selected.

At step 215, a first assigning/justifying operation formed by a sub 1 operation and a sub 2 operation is carried out. For example, as shown in (A) of FIG. 8, the sub 1 operation uses logic value V (for example, 0), and the sub 2 operation uses its opposite logic value P (for example, 1). First, in the sub 1 operation, the logic value V is assigned to the X-bit "ppi" of the pseudo external input lines of the target bit pair, and a necessary logic value is determined for the X-bit of the test cube so that the logic value V may appear in the X-bit "ppo" of the pseudo external output lines of the target bit pair. In this sub 1 operation, the setting of the necessary logic value is impossible and therefore, the setting may fail. When the sub 1 operation has failed, the sub 2 operation is carried out using the above-mentioned operation by replacing the logic value V with the logic value P.

When the above-mentioned first assigning/justifying operation formed by the sub 1 operation and the sub 2 operation has failed, the control proceeds from step 217 to step 218 which carries out a second assigning/justifying operation formed by a sub 3 operation and a sub 4 operation. For example, as shown in (B) of FIG. 8, at the sub 3 operation, the logic value V is assigned to the X-bit "ppi" of the pseudo external input lines of the target bit pair, and a necessary logic value is determined for the X-bit of the test cube so that the logic value P may appear in the X-bit ppo of the pseudo external output lines of the target bit pair. When the sub 3 operation has failed, in the sub 4 operation, the logic value P is assigned to the X-bit "ppi" of the pseudo external input lines of the target bit pair, and a necessary logic value is determined for the X-bit of the test cube so that the logic value V may appear in the X-bit ppo of the pseudo external output lines of the target bit pair.

At step 219, a logic simulation is carried out so that some or all of the X-bits at the external output lines PO and the pseudo external output lines PPO are determined. Then, the control returns to step 202.

The above-described program of FIG. 2 is stored in a memory medium. For example, if the memory medium is a non-volatile memory such as a ROM, the program is incorporated thereinto in advance, while, if the memory medium is a volatile memory such as a RAM, the program is written thereinto as occasion demands.

The invention claimed is:

1. A test generation method of a semiconductor logic circuit device comprising:
 a combinational portion including external input lines, pseudo external input lines, external output lines and pseudo external output lines; and
 a plurality of scan flip-flops connected between said pseudo external output lines and said pseudo external input lines, such that said plurality of scan flip-flops are connected in series to each other as a shift register, thus realizing at least one scan chain, said test generation method comprising:

converting a test cube including one or more unspecified bits in said external input lines and said pseudo external input lines into a test vector including no unspecified bits to reduce a number of discrepancies between bits of said pseudo external input lines and respective bits of said pseudo external output lines, wherein said converting comprises determining a case type by determining a bit state of said pseudo external input lines and a bit state of said pseudo external output lines, wherein the determining of a case type comprises:

a case type 1 defined by a state where there are no unspecified bits in said pseudo external input lines and said pseudo external output lines;

a case type 2 defined by a state where there is at least one unspecified bit in said pseudo external input lines and there is no unspecified bit in said pseudo external output lines;

a case type 3 defined by a state where there is no unspecified bit in said pseudo external input lines and there is at least one unspecified bit in said pseudo external output lines; and a case type 4 defined by a state where there is at least one unspecified bit in said pseudo external input lines and there is at least one unspecified bit in said pseudo external output lines.

2. The test generation method of a semiconductor logic circuit device as set forth in claim 1, wherein said converting comprises a 0/1 filling to fill 0 or 1 in all unspecified bits of said external input lines when the bit state of said pseudo external input lines and the bit state of said external output lines are determined by said case type determining to be in case type 1, and said converting being completed after said 0/1 filling is completed.

3. The test generation method of a semiconductor logic circuit device as set forth in claim 1, wherein said converting comprises:

assigning to all unspecified bits of said external input lines logic values of bits of said external output lines corresponding to the unspecified bits of said external input lines when the bit state of said pseudo external input lines and the bit state of said external output lines are determined by said case type determining to be in case type 2; and executing a logic simulation after said assigning, such that all unspecified bits of said external output lines and said pseudo external output lines are determined to be 0 or 1, thus returning to said case type determining after said execution of logic simulation.

4. The test generation method of a semiconductor logic circuit device as set forth in claim 1, wherein said converting comprises:

a first justifying to select one unspecified bit of said pseudo external input lines as a target unspecified bit when a bit state of said pseudo external input lines and the bit state of said external output lines are determined by said determining of case type to be in case type 3, and to determine one unspecified bit of said external input lines to be 0 or 1 such that a logic value of a bit of said pseudo external input lines corresponding to said target unspecified bit is assigned to said target unspecified bit;

a second justifying to determine the unspecified bit of said external input lines to be 0 or 1 such that a logic value opposite to the logic value of the bit of said pseudo external input lines corresponding to said target unspecified bit appears at said target unspecified bit; and carrying out a logic simulation after said first justifying has succeeded or after said second justifying is carried out after said first justifying step has failed, such that all unspecified bits of said external output lines and said pseudo external output lines are determined to be 0 or 1, thus returning to said case type determining after said carrying out said logic simulation.

5. The test generation method of a semiconductor logic circuit device as set forth in claim 1, wherein said converting comprises:

determining a bit pair type by determining a state of a bit pair <ppi, ppo> formed by a bit "ppo" of said pseudo external output lines when the bit state of said pseudo external input lines and the bit state of said external output lines are determined by said determining of case type to be in case type 4, such that a bit pair type A is defined by a state where "ppi"=0 or 1 and "ppo"=0 or 1, a bit pair type B is defined by a state where "ppi"=unspecified bit and "ppo"=0 or 1, a bit pair type C is defined by a state where "ppi"=0 or 1 and "ppo"=unspecified bit, and a bit pair type D is defined by a state where "ppi"=unspecified bit and "ppo"=unspecified bit;

assigning to all input line side bits "ppi" of said bit pair type B logic values of output line side bits "ppo" corresponding to the input line side bits when the number of bit pairs of said bit pair type B is not zero at said pseudo external input lines and said external output lines;

a first justifying to select one bit pair bit of said bit pair type C as a target bit pair when the number of bit pairs of said bit pair type B is zero and the number of bit pairs of said bit pair type C is not zero at said pseudo external input lines and said external output lines, and to determine one unspecified bit of said external input lines and said pseudo external input lines to be 0 or 1 such that a logic value of an input line side bit "ppi" of said target bit pair corresponding to an output line side bit "ppo" of said target bit pair appears at the output line side bit "ppo" of said target bit pair;

a second justifying adapted to determine the unspecified bit of said external input lines and said pseudo external input lines to be 0 or 1 so that a logic value opposite to the logic value of the input line side bit "ppi" of said target bit pair corresponding to the output line side bit "ppo" of said target bit pair appears at the output line side bit "ppo" of said target bit pair;

a first assigning and justifying to select one bit pair of said bit pair type D as a target bit pair when there are no bit pairs of said bit pair type B and no bit pairs of said bit pair type C and there are one or more bit pairs of said bit pair type D, to assign a logic value to an input line side bit "ppi" of said target bit pair so that the logic value of the input line side bit "ppi" of said target bit pair appears at an output line side bit "ppo" of said target bit pair, and to determine one unspecified bit of said external input lines and said pseudo external input lines to be 0 or 1 thus justifying the logic value of the output line side bit "ppo" of said target bit pair;

a second assigning and justifying to assign a logic value to the input line side bit "ppi" of said target bit pair so that a logic value opposite to the logic value of the input line side bit "ppi" of said target bit pair appears at the output line side bit "ppo" of said target bit pair, and to determine one unspecified bit of said external input lines and said pseudo external input lines to be 0 or 1 thus justifying the logic value of the output line side bit "ppo" of said target bit pair; and a logic simulating to carry out a logic simulation after said assigning, said justifying, and said first or second assigning and justifying, such that all unspecified bits of said external output lines and said pseudo external output lines are determined to be 0 or 1, thus returning to said determining of case type after said logic simulating.

6. A test generation program of a semiconductor logic circuit device comprising:

a combinational portion having external input lines, pseudo external input lines, external output lines and pseudo external output lines; and a plurality of scan flip-flops connected between said pseudo external output lines and said pseudo external input lines, such that said scan flip-flops are connected in series to each other as a shift register, thus realizing at least one scan chain, said test program, being stored in a non-transitory computer readable medium, to be carried out by a computer comprising a converting processing to convert a test cube including one or more unspecified bits in said external input lines and said pseudo external input lines into a test vector including no unspecified bits to reduce a number of discrepancies between bits of said pseudo external input lines and respective bits of said pseudo external output lines, wherein said converting processing comprises a case type determination processing to determine a bit state of said pseudo external input lines and a bit state of said pseudo external output lines, wherein a case type 1 of a case type determination processing is defined by a state where there are no unspecified bits in said pseudo external input lines and said pseudo external output lines, wherein a case type 2 of a case type determination processing is defined by a state where there is at least one unspecified bit in said pseudo external input lines and there is no unspecified bit in said pseudo external output lines, wherein a case type 3 of a case type determination processing is defined by a state where there is no unspecified bit in said pseudo external input lines and there is at least one unspecified bit in said pseudo external output lines, and a case type 4 of a case type determination processing is defined by a state where there is at least one unspecified bit in said pseudo external input lines and there is at least one unspecified bit in said pseudo external output lines.

7. The test generation program of a semiconductor logic circuit device as set forth in claim 6, wherein said converting processing comprises a 0/1 filling processing to fill 0 or 1 in all unspecified bits of said external input lines when the bit state of said pseudo external input lines and the bit state of said external output lines are determined by said case type determining processing to be in case type 1, said converting processing being completed after said 0/1 filling processing is completed.

8. The test generation program of a semiconductor logic circuit device as set forth in claim 6, wherein said converting processing comprises:

an assigning processing to assign to all unspecified bits of said external input lines logic values of bits of said external output lines corresponding to the unspecified bits of said external input lines when the bit state of said pseudo external input lines and the bit state of said external output lines are determined by said case type determining processing to be in case type 2; and a logic simulating processing to carry out a logic simulation after said assigning processing, such that all unspecified bits of said external output lines and said pseudo external output lines are determined to be 0 or 1, thus returning to said case type determining processing after said logic simulating processing.

9. The test generation program of a semiconductor logic circuit device as set forth in claim 6, wherein said converting processing comprises:

a first justifying processing to select one unspecified bit of said pseudo external output lines as a target unspecified bit when the bit state of said pseudo external input lines and the bit state of said external output lines are determined by said case type determining processing to be in case type 3, and to determine one unspecified bit of said external input lines to be 0 or 1 such that a logic value of a bit of said pseudo external input lines corresponding to said target unspecified bit is assigned to said target unspecified bit;

a second justifying processing to determine the unspecified bit of said external input lines to be 0 or 1 such that a logic value opposite to the logic value of the bit of said pseudo external input lines corresponding to said target unspecified bit appears at said target unspecified bit; and a logic simulating processing to carry out a logic simulation after said first justifying processing has succeeded or after said second justifying processing is carried out after said first justifying processing has failed, such that all unspecified bits of said external output lines and said pseudo external output lines are determined to be 0 or 1, thus returning to said case type determining processing after said logic simulating processing.

10. The test generation program of a semiconductor logic circuit device as set forth in claim 6, wherein said converting processing comprises:

a bit pair type determining processing to determine a state of a bit pair <ppi, ppo> formed by a bit "ppo" of said pseudo external output lines when the bit state of said pseudo external input lines and the bit state of said external output lines are determined by said case type determining processing to be in case type 4, such that a bit pair type A is defined by a state where "ppi"=0 or 1 and "ppo"=0 or 1, a bit pair type B is defined by a state where "ppi"=unspecified bit and "ppo"=0 or 1, a bit pair type C is defined by a state where "ppi"=0 or 1 and "ppo"=unspecified bit, and a bit pair type D is defined by a state where "ppi"=unspecified bit and "ppo"=unspecified bit;

an assigning processing to assign to all input line side bits "ppi" of said bit pair type B logic values of output line side bits "ppo" corresponding to the input line side bits when the number of bit pairs of said bit pair type B is not zero at said pseudo external input lines and said external output lines;

a first justifying processing to select one bit pair bit of said bit pair type C as a target bit pair when the number of bit pairs of said bit pair type B is zero and the number of bit pairs of said bit pair type C is not zero at said pseudo external input lines and said external output lines, and to determine one unspecified bit of said external input lines and said pseudo external input lines to be 0 or 1 so that a logic value of an input line side bit "ppi" of said target bit pair corresponding to an output line side bit "ppo" of said target bit pair appears at the output line side bit "ppo" of said target bit pair;

a second justifying processing to determine the unspecified bit of said external input lines and said pseudo external input lines to be 0 or 1 so that a logic value opposite to the logic value of the input line side bit "ppi" of said target bit pair corresponding to the output line side bit "ppo" of said target bit pair appears at the output line side bit "ppo" of said target bit pair;

a first assigning and justifying processing to select one bit pair of said bit pair type D as a target bit pair when there are no bit pairs of said bit pair type B and no bit pairs of said bit pair type C and there are one or more bit pairs of said bit pair type D, to assign a logic value to an input line side bit "ppi" of said target bit pair so that the logic value of the input line side bit "ppi" of said target bit pair appears at an output line side bit "ppo" of said target bit pair, and to determine one unspecified bit of said external input lines and said pseudo external input lines to be 0 or 1 thus justifying the logic value of the output line side bit "ppo" of said target bit pair;

a second assigning and justifying processing to assign a logic value to the input line side bit "ppi" of said target bit pair so that a logic value opposite to the logic value of the input line side bit "ppi" of said target bit pair appears at the output line side bit "ppo" of said target bit pair, and to determine one unspecified bit of said external input lines and said pseudo external input lines to be 0 or 1 thus justifying the logic value of the output line side bit "ppo" of said target bit pair; and a logic simulating processing adapted to carry out a logic simulation after said assigning processing, said justifying processing, and said first or second assigning and justifying processing, such that all unspecified bits of said external output lines and said pseudo external output lines are determined to be 0 or 1, thus returning to said case type determining processing after said logic simulating processing.

11. The test generation method of a semiconductor logic circuit device as set forth in claim 1, wherein said converting comprises determining a bit pair type by determining a state of a bit pair formed by a bit "ppo" of said pseudo external output lines when the bit state of said pseudo external input lines and the bit state of said external output lines are determined by said determining of case type to be in case type 4, such that a bit pair type A is defined by a state where "ppi"=0 or 1 and "ppo"=0 or 1, a bit pair type B is defined by a state where "ppi"=unspecified bit and "ppo"=0 or 1, a bit pair type C is defined by a state where "ppi"=0 or 1 and "ppo"=unspecified bit, and a bit pair type D is defined by a state where "ppi"=unspecified bit and "ppo"=unspecified bit.

12. The test generation method of a semiconductor logic circuit device as set forth in claim 11, wherein said converting comprises assigning to all input line side bits "ppi" of said bit pair type B logic values of output line side bits "ppo" corresponding to the input line side bits when the number of bit pairs of said bit pair type B is not zero at said pseudo external input lines and said external output lines.

13. The test generation method of a semiconductor logic circuit device as set forth in claim 11, wherein said converting comprises a first justifying to select one bit pair bit of said bit pair type C as a target bit pair when the number of bit pairs of said bit pair type B is zero and the number of bit pairs of said bit pair type C is not zero at said pseudo external input lines and said external output lines, and to determine one unspecified bit of said external input lines and said pseudo external input lines to be 0 or 1 such that a logic value of an input line side bit "ppi" of said target bit pair corresponding to an output line side bit "ppo" of said target bit pair appears at the output line side bit "ppo" of said target bit pair.

14. The test generation method of a semiconductor logic circuit device as set forth in claim 11, wherein said converting comprises a second justifying adapted to determine the unspecified bit of said external input lines and said pseudo external input lines to be 0 or 1 so that a logic value opposite to the logic value of the input line side bit "ppi" of said target bit pair corresponding to the output line side bit "ppo" of said target bit pair may appear at the output line side bit "ppo" of said target bit pair.

15. The test generation method of a semiconductor logic circuit device as set forth in claim 11, wherein said converting comprises a first assigning and justifying to select one bit pair of said bit pair type D as a target bit pair when there are no bit pairs of said bit pair type B and no bit pairs of said bit pair type C and there are one or more bit pairs of said bit pair type D, to assign a logic value to an input line side bit "ppi" of said target bit pair so that the logic value of the input line side bit "ppi" of said target bit pair appears at an output line side bit "ppo" of said target bit pair, and to determine one unspecified bit of said external input lines and said pseudo external input lines to be 0 or 1 thus justifying the logic value of the output line side bit "ppo" of said target bit pair.

16. The test generation method of a semiconductor logic circuit device as set forth in claim 11, wherein said converting comprises:

a second assigning and justifying to assign a logic value to the input line side bit "ppi" of said target bit pair so that a logic value opposite to the logic value of the input line side bit "ppi" of said target bit pair may appear at the output line side bit "ppo" of said target bit pair, and to determine one unspecified bit of said external input lines and said pseudo external input lines to be 0 or 1 thus justifying the logic value of the output line side bit "ppo" of said target bit pair; and a logic simulating to carry out a logic simulation after said assigning, said justifying, and said first or second assigning and justifying, such that all unspecified bits of said external output lines and said pseudo external output lines are determined to be 0 or 1, thus returning to said determining of case type after said logic simulating.

* * * * *